(12) United States Patent
Jambunathan et al.

(10) Patent No.: US 10,672,868 B2
(45) Date of Patent: Jun. 2, 2020

(54) METHODS OF FORMING SELF ALIGNED SPACERS FOR NANOWIRE DEVICE STRUCTURES

(71) Applicant: Intel Corporation, Santa Clara, CA (US)

(72) Inventors: Karthik Jambunathan, Portland, OR (US); Glenn Glass, Portland, OR (US); Anand Murthy, Portland, OR (US); Jun Sung Kang, Portland, OR (US); Seiyon Kim, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 15/778,724

(22) PCT Filed: Dec. 24, 2015

(86) PCT No.: PCT/US2015/000420
§ 371 (c)(1),
(2) Date: May 24, 2018

(87) PCT Pub. No.: WO2017/111850
PCT Pub. Date: Jun. 29, 2017

(65) Prior Publication Data
US 2018/0358436 A1    Dec. 13, 2018

(51) Int. Cl.
*H01L 29/06*    (2006.01)
*H01L 29/78*    (2006.01)
(Continued)

(52) U.S. Cl.
CPC ........ *H01L 29/0673* (2013.01); *B82Y 10/00* (2013.01); *H01L 29/06* (2013.01);
(Continued)

(58) Field of Classification Search
CPC . H01L 29/06; H01L 29/0673; H01L 29/0847; H01L 29/41725; H01L 29/42392;
(Continued)

(56) References Cited

U.S. PATENT DOCUMENTS 8,728,885 B1 * 5/2014 Pham .................. H01L 29/0673
257/E21.623
9,129,827 B2 * 9/2015 Cappellani ............ H01L 21/76
(Continued)

FOREIGN PATENT DOCUMENTS

| WO | 2013085534 | 6/2013 |
|---|---|---|
| WO | 2014018201 | 1/2014 |
| WO | 2015050546 | 4/2015 |

OTHER PUBLICATIONS

International Search Report and Written Opinion for International Patent Application No. PCT/US15/00420, dated Aug. 24, 2016.
(Continued)

*Primary Examiner* — Earl N Taylor
(74) *Attorney, Agent, or Firm* — Green, Howard, & Mughal LLP

(57) ABSTRACT

Methods of forming self-aligned nanowire spacer structures are described. An embodiment includes forming a channel structure comprising a first nanowire and a second nanowire. Source/drain structures are formed adjacent the channel structure, wherein a liner material is disposed on at least a portion of the sidewalls of the source/drain structures. A nanowire spacer structure is formed between the first and second nanowires, wherein the nanowire spacer comprises an oxidized portion of the liner.

21 Claims, 10 Drawing Sheets

(51) Int. Cl.
   *B82Y 10/00* (2011.01)
   *H01L 29/417* (2006.01)
   *H01L 29/66* (2006.01)
   *H01L 29/775* (2006.01)
   *H01L 29/08* (2006.01)
   *H01L 29/786* (2006.01)
   *H01L 29/423* (2006.01)

(52) U.S. Cl.
   CPC .... *H01L 29/0847* (2013.01); *H01L 29/41725* (2013.01); *H01L 29/42392* (2013.01); *H01L 29/66439* (2013.01); *H01L 29/775* (2013.01); *H01L 29/78* (2013.01); *H01L 29/78696* (2013.01)

(58) Field of Classification Search
   CPC . H01L 29/66439; H01L 29/775; H01L 29/78; H01L 29/78696
   See application file for complete search history.

(56) References Cited

U.S. PATENT DOCUMENTS

| | | | | |
|---|---|---|---|---|
| 9,472,613 | B2* | 10/2016 | Cappellani | H01L 21/76 |
| 9,634,091 | B2* | 4/2017 | Ching | H01L 21/823821 |
| 9,673,302 | B2* | 6/2017 | Cappellani | H01L 21/76 |
| 9,905,672 | B2* | 2/2018 | Wang | H01L 21/02236 |
| 9,935,205 | B2* | 4/2018 | Kim | H01L 29/66795 |
| 10,163,729 | B2* | 12/2018 | Ching | H01L 21/823821 |
| 2010/0155827 | A1* | 6/2010 | Kim | H01L 29/42392 257/327 |
| 2010/0295022 | A1* | 11/2010 | Chang | B82Y 10/00 257/24 |
| 2011/0108803 | A1* | 5/2011 | Deligianni | B82Y 10/00 257/24 |
| 2013/0313513 | A1* | 11/2013 | Cappellani | H01L 21/02587 257/9 |
| 2014/0001441 | A1* | 1/2014 | Kim | H01L 29/0673 257/29 |
| 2014/0264280 | A1* | 9/2014 | Kim | H01L 29/785 257/29 |
| 2014/0285980 | A1* | 9/2014 | Cappellani | H01L 29/76 361/748 |
| 2015/0333162 | A1* | 11/2015 | Bouche | H01L 21/76897 257/24 |
| 2015/0380481 | A1* | 12/2015 | Cappellani | H01L 21/76 257/499 |
| 2016/0276484 | A1* | 9/2016 | Kim | H01L 29/7851 |
| 2017/0005176 | A1* | 1/2017 | Sung | H01L 21/3065 |
| 2017/0040438 | A1* | 2/2017 | Cappellani | H01L 21/76 |
| 2017/0263706 | A1* | 9/2017 | Gardner | H01L 29/267 |
| 2018/0138289 | A1* | 5/2018 | Rachmady | H01L 29/66545 |
| 2018/0158927 | A1* | 6/2018 | Mohapatra | H01L 29/42392 |
| 2018/0204955 | A1* | 7/2018 | Mehandru | H01L 29/42392 |
| 2018/0212023 | A1* | 7/2018 | Weber | H01L 21/823807 |
| 2018/0248011 | A1* | 8/2018 | Mehandru | H01L 29/78618 |
| 2018/0323264 | A1* | 11/2018 | Le | H01L 29/04 |
| 2018/0358436 | A1* | 12/2018 | Jambunathan | H01L 29/78 |
| 2018/0366587 | A1* | 12/2018 | Le | H01L 29/66545 |

OTHER PUBLICATIONS

Extended European Search Report dated Jun. 25, 2019 for EP Patent Application No. 15911549.2.

* cited by examiner

METHODS OF FORMING SELF ALIGNED SPACERS FOR NANOWIRE DEVICE STRUCTURES

CLAIM OF PRIORITY

This Application is a National Stage Entry of, and claims priority to, PCT Application No. PCT/US15/00420, filed on 24 Dec. 2015 and titled "METHODS OF FORMING SELF ALIGNED SPACERS FOR NANOWIRE DEVICE STRUCTURES", which is incorporated by reference in its entirety for all purposes.

BACKGROUND OF THE INVENTION

Higher performance, lower cost, increased miniaturization of integrated circuit components are ongoing goals of the microelectronic industry for the fabrication of microelectronic devices. To achieve these goals, transistors within the microelectronic devices must scale down, i.e. become smaller. Along with the reduction in the size of transistors, there has also been a drive to improve their efficiency with improvement in their designs, materials used, and/or in their fabrication processes. Such design improvements include the development of unique structures, such as non-planar transistors, including tri-gate transistors, FinFETs, TFETS, omega-FETs, nanowire, nanoribbon, double-gate and gate all around (GAA) transistors.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1:
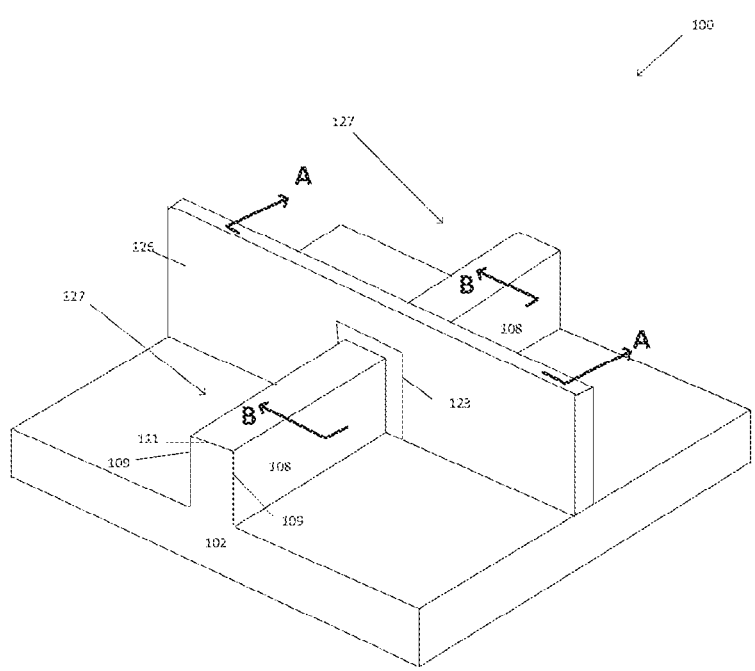
FIG. 1 represents a perspective view of a non-planar transistor structure according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them.

Implementations of the embodiments herein may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope.

A plurality of transistors, such as metal-oxide-semiconductor field-effect transistors (MOSFET or simply MOS transistors), may be fabricated on the substrate. In various implementations, the MOS transistors may be planar transistors, nonplanar transistors, or a combination of both. Nonplanar transistors include FinFET transistors such as double-gate transistors and tri-gate transistors, TFET and wrap-around or all-around gate transistors such as nanoribbon and nanowire transistors.

Each transistor may include a gate stack formed of at least two layers, for example, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc.

The gate electrode layer may be formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

Source and drain regions may be formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. Source/drain may comprise a source or a drain structure/region, depending upon the particular implenetation within the device, in an embodiment.

In an embodiment, the substrate may first be etched to form recesses at the locations of the source and drain regions. A deposition process, such as an epitaxial process for example, may then be carried out to fill the recesses with material that is used to fabricate the source and drain structures, as will be discussed in more detail with respect to the various embodiments included herein. In some implementations, the source and drain structures may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain structures may be formed using one or more alternate semiconductor materials such as germanium or a group III-V material or alloy.

One or more interlayer dielectrics (ILD) are deposited over/within the MOS transistor structures. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Non-planar transistors 100, such as a tri-gate transistor structures, may include at least one non-planar transistor fin 108 (FIG. 1). The non-planar transistor fin 108 may have a top 111 surface and a pair of laterally opposite sidewalls 109, as will be depicted further herein. At least one non-planar gate electrode 126 may be formed over the non-planar transistor fin 108. The non-planar transistor gate electrode 126 may be fabricated by forming a gate dielectric layer on or adjacent to the non-planar transistor fin 108 top surface 111 and on or adjacent to the non-planar transistor fin sidewalls 109.

In an embodiment, the non-planar transistor fin 108 may run in a direction substantially perpendicular to the non-planar transistor gate 126. Source/drain structures (not shown) may be formed in the non-planar transistor fin 108 on opposite sides of the gate electrode 126. In an embodiment, the source and drain structures may be formed by removing portions of the non-planar transistor fins 108 and replacing these portions with appropriate material(s) to form the source and drain structures. Other methods or combination of methods, may be utilized to form the source/drain structures, according to the particular application.

Embodiments of methods of forming microelectronic device structures, such as methods of forming self-aligned spacer structures in nanowire transistor structures, for example, are described herein. Those methods/structures may include forming a channel structure comprising a first nanowire and a second nanowire. Source/drain structures are formed adjacent the channel structure, wherein a liner material is disposed on at least a portion of the sidewalls of the source/drain. A nanowire spacer structure may be formed between the first and second nanowires. The nanowire spacer may comprise an oxidized portion of the liner. The embodiments herein significantly reduce or eliminate gate to source/drain shorts that may be associated with transistors, such as in non-planar, nanowire and nanoribbon devices.

Figure 2:
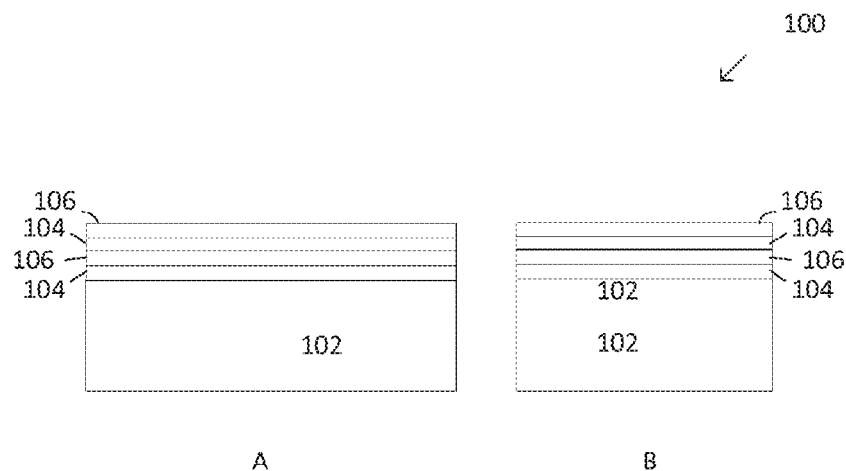
FIG. 2 represents cross-sectional views of a structures according to embodiments.
Figure 9:
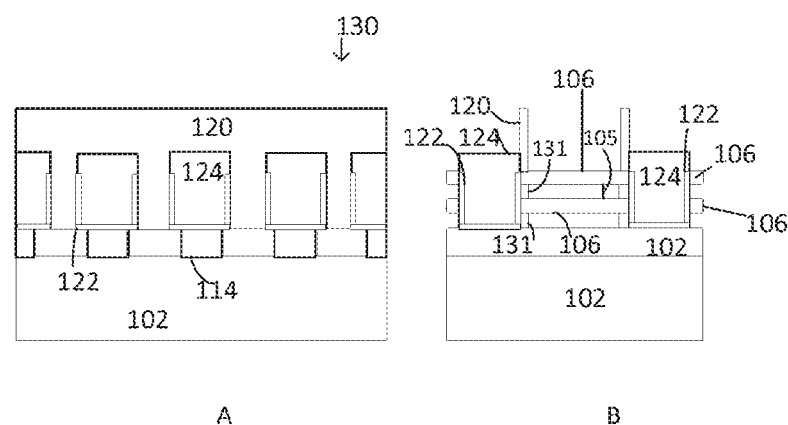
FIG. 9 represents cross-sectional views of a structures according to embodiments.
Figure 10:
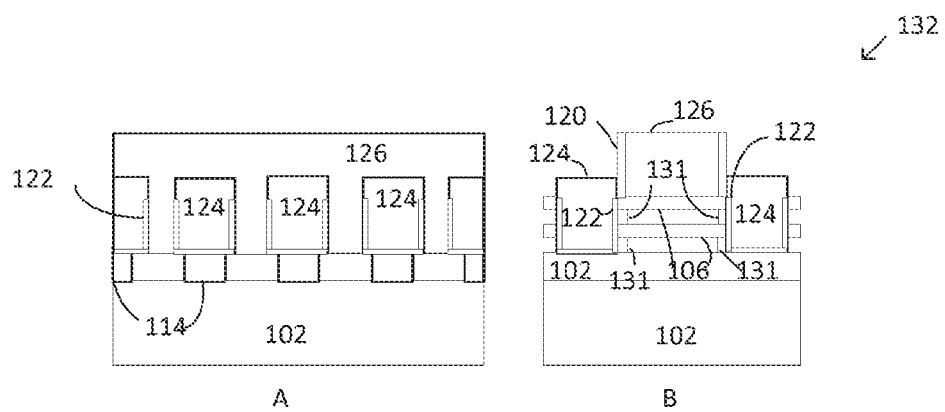
FIG. 10 represents cross-sectional views of a structures according to embodiments.
Figure 11:
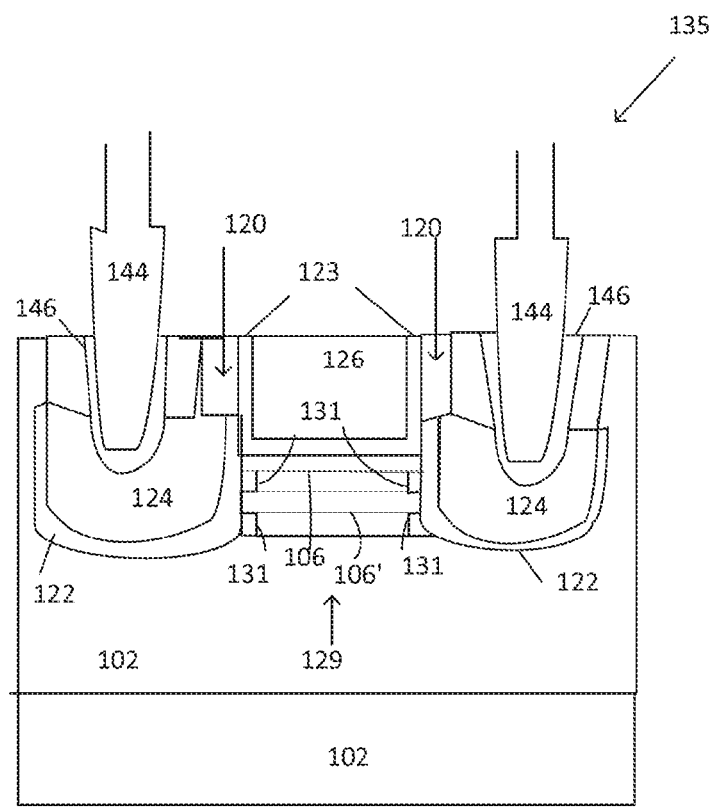
FIG. 11 represents cross-sectional views of a structures according to embodiments.

FIGS. 2-11 illustrate side cross-sectional views of embodiments of fabricating internal self-aligned spacer structures in microelectronic devices, wherein FIGS. 2-10 are views along arrows A-A and B-B of FIG. 1, and FIG. 11 is a view along arrows A-A of FIG. 1. The embodiments include but are not limited to nanowire/nanoribbon devices. In FIG. 2, a device 100, such as a non-planar transistor device 100, may comprise a substrate 102, such as a silicon substrate or a silicon on insulator substrate 102, for example. In an embodiment, alternating layers may be formed on the substrate 102. For example, a first material 104 may be formed on the substrate 102. In an embodiment, the first material 104 may comprise a sacrificial material 104, and may comprise a silicon germanium material, for example. In an embodiment, the first material 104 may comprise about 20 percent to about 100 percent germanium. A second material 106 may be formed on the first material 104. The second material 106 may comprise a nanowire material 106, and may comprise any suitable material that may be used for the formation of nanowire structures, such as but not limited to silicon and alloys of Si and Ge, in an embodiment. In an embodiment, the first and second materials 104, 106 may be alternated to form a stack of alternating layers formed on each other, and the stack may comprise any suitable number of alternating first and second layers of materials 104, 106. The formation process may include such precursor materials containing, but not limited to, silicon and germanium silane, dichlorosilane, disilane, germane, digermane, dicholorogermane, and the like, and may be formed in a vacuum chamber with a deposition pressure of between about $10^{-5}$-$10^{3}$ Torr, at temperatures of between about 500 degrees Celsius and about 800 degrees Celsius, in an embodiment.

Figure 3:
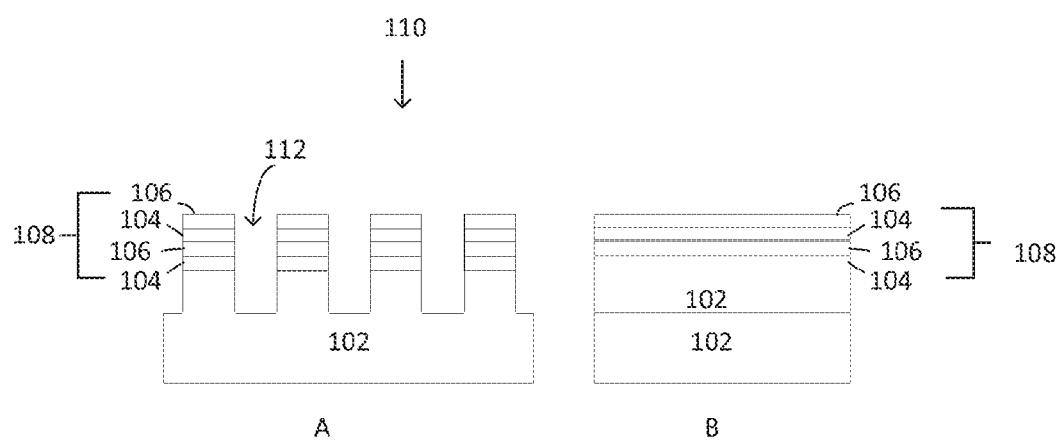
FIG. 3 represents cross-sectional views of a structures according to embodiments.
Figure 4:
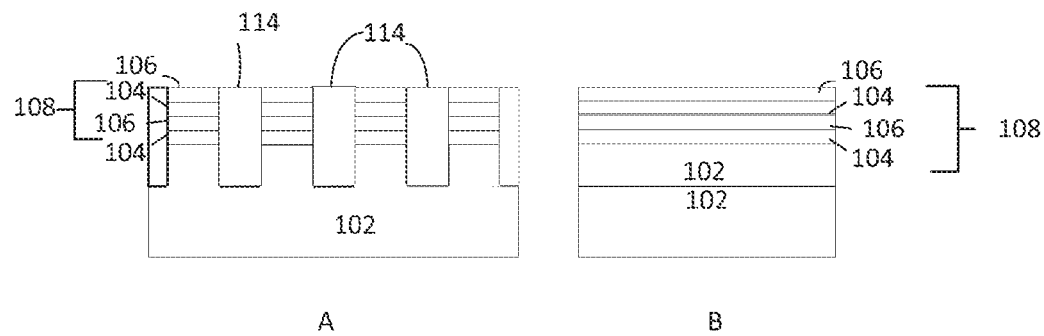
FIG. 4 represents cross-sectional views of a structures according to embodiments.
Figure 5:
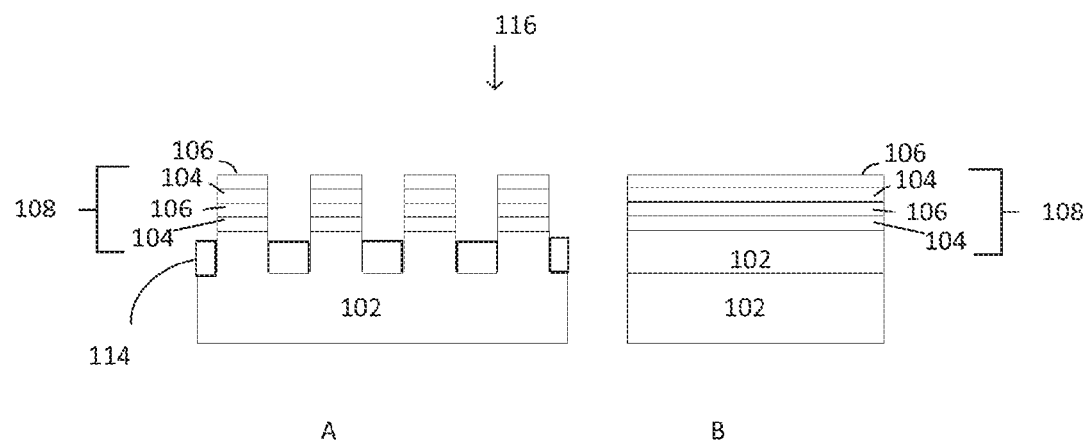
FIG. 5 represents cross-sectional views of a structures according to embodiments.

In an embodiment, a trench 112 may be formed through the alternating stack of layers 104, 106 and through a portion of the substrate 102 by utilizing an etch process 110, which may comprise a wet and/or dry etch process (FIG. 3). Fins 108 may be formed wherein the fins 108 comprise the alternating stack of layers 104, 106, in an embodiment. A dielectric material 114 may be formed in the trench 112, such as a shallow trench isolation material (FIG. 4). The dielectric material 114 may then be recessed using an etch process 116 (FIG. 5) such that the fins 108 may extend above a top surface of the dielectric material 114.

Figure 6:
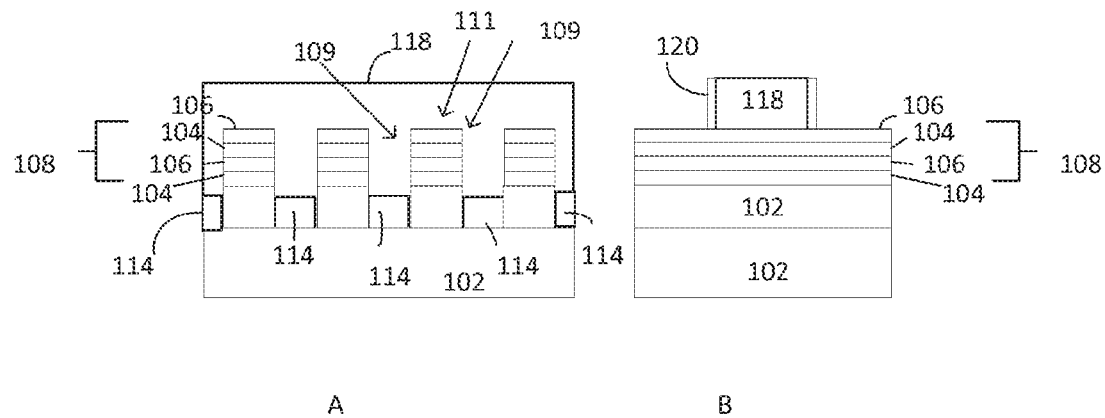
FIG. 6 represents cross-sectional views of a structures according to embodiments.

In an embodiment, a gate structure 118 may be formed on and around the array of fins 108 (FIG. 6). In an embodiment, the gate structure 118 may be fabricated by forming a gate dielectric layer 123 (as depicted in to FIG. 1) on or adjacent the fin 108 top surface 111 and on or adjacent to the laterally opposing fin sidewalls 109, and then forming a gate electrode material on or adjacent the gate dielectric layer. In an embodiment, the gate structure 118 comprises a polysilicon gate material, and may comprise a sacrificial gate material in an embodiment. The gate 118 may surround each of the individual fins 108. In an embodiment, a gate spacer 120 may be on at least a portion of the lateral sides of the gate 118, and may comprise a dielectric material, and may contain, but is not limited to, silicon, oxygen, nitrogen, or carbon in an embodiment. In an embodiment, a portion of the fins 108 adjacent the gate structure 118 may comprise a source/drain region 127 (as shown in FIG. 1) of a non-planar device, for example.

Figure 7:
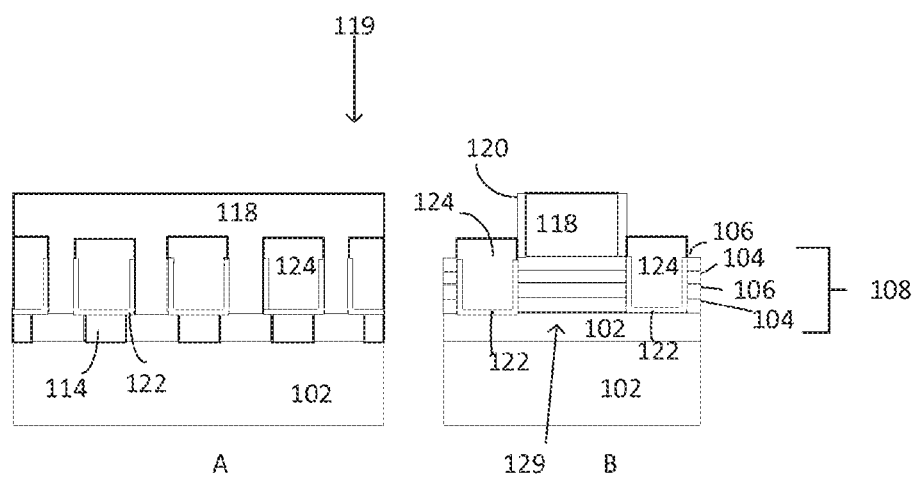
FIG. 7 represents cross-sectional views of a structures according to embodiments.

In an embodiment, an etch process 119 may remove a portion of the fins 108 in the source drain regions 127 (FIG. 7). In an embodiment, source/drain structures 124 may be formed adjacent the gate structure 118, with a formation process with precursor materials containing, but not limited to, silicon, germaium silane, dichlorosilane, disilane, germane, digermane, dicholorogermane, for example, and may be formed in a vacuum chamber with a deposition pressure between about $10^{-5}$ to $10^3$ Torr, and may be formed at temperatures between about 500 degrees Celsius and about 800 degrees Celsius. The dopant atoms such as boron, aluminum, phosphorus, antimony, and arsenic may be incorporated in-situ during a deposition process of the source/drain, in an embodiment. In another embodiment, the dopants may be added later via an implantation step, for example on the source/drain regions 127 (referring back to FIG. 1). In an embodiment, the source/drain structures 124 may comprise a silicon germanium material, although in other embodiments, any suitable source/drain material, including dopants, may be formed. For example, the source/drain material may comprise a silicon germanium, wherein a boron concentration may be included comprising between about $5 \times 10^{19}$ to about $1 \times 10^{21}$ atoms per $cm^3$. In an embodiment, the source/drain material may be included in a PMOS type transistor, and may include other types of p-type dopants. In another embodiment, the source/drain material may comprise an n-type dopant, such as arsenic, phosphorus and/or antimony, and may be included in an NMOS type transistor structure, for example.

A liner material 122 may be formed on a portion of the substrate 102 and on opposing sidewalls of the source/drain structure 124. In an embodiment, the source/drain formation process may include the liner 122 formation, and in other embodiments, the liner 122 formation may occur in a separate deposition step, for example. In an embodiment, the liner 122 may be in contact, and in some cases may be in direct contact, with the alternating layers 104, 106 that remain underneath the gate structure 118, which may comprise a channel region 129. In an embodiment, the liner material 122 may be in direct contact with the alternating layers 104, 106 and may also be in direct contact with the source/drain structure 124. In an embodiment, the liner material 122 may comprise an etch rate in an etchant that is substantially lower than the sacrificial material 104, and may comprise a higher oxidizing rate than the nanowire material 106.

In an embodiment, the liner material 122 may comprise a silicon carbide material/alloy. In an embodiment, the liner material 122 may comprise a carbon concentration of about 1 to about 30 percent, but in other embodiments the concentration of carbon may vary according to the particular application. In an embodiment, the liner material 122 may comprise a thickness of about 0.5 to about 5 nm, but may comprise other thickness according to different embodiments.

Figure 8:
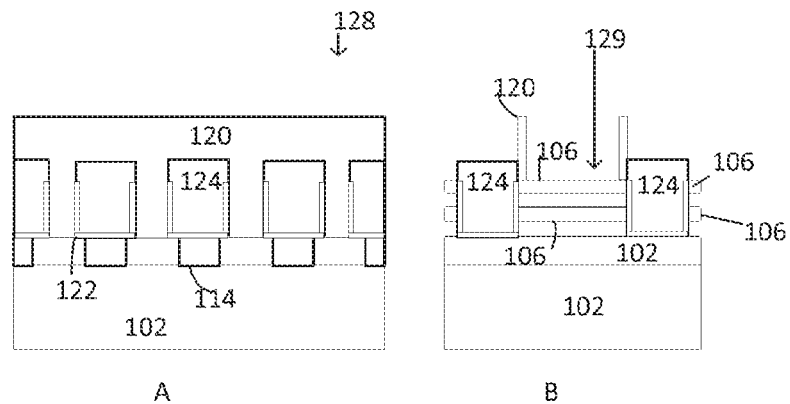
FIG. 8 represents cross-sectional views of a structures according to embodiments.

In an embodiment, an etch process 128 may be employed wherein the sacrificial material 104 may be removed from the stacked alternating layers 104, 106, so that the channel nanowires 106 remain in the channel region 129, and at least a portion or all of the sacrificial gate structure 118 may also be removed, either in the same etch process 128 or in a separate etch process (FIG. 8). In an embodiment, the etch process 128 comprises a selective etch process 128, wherein the nanowire material 106 and the liner material 122 each comprise little to no etch rate during the etch process, and wherein the sacrificial material 104 and the sacrificial gate material 118 comprise relatively high etch rates during the etch process. In an embodiment, the gate spacer 120 remains (is not etched away) adjacent to the source/drain structure 124, adjacent to the liner material 122, and adjacent to the channel nanowire structures 106. In an embodiment, the gate spacer 120 may be in direct contact with one or more of the liner material 122, the source/drain material and the channel nanowire 106. In other embodiments, the gate spacer 120 may not be in direct contact with any of the liner 122, the channel nanowire 106 or the source/drain material.

A chemical conversion process 130, which may comprise any suitable oxidation and/or conversion process such as an oxidation, nitridation, or carbide formation process, may be performed, wherein a portion of the liner 122 may be converted into a converted portion 131 and a portion of the channel nanowires 106 may be converted as well, but at a much slower rate (FIG. 9). For example, a portion of the liner 122 may be converted by an oxidation process, a nitridation process, or by any other type of physical/chemical means which may serve to convert a portion of the liner 122 into a converted portion 131. For example, in an embodiment, the liner 122 may comprise a faster oxidation rate during an oxidation process 130, than an oxidation rate of the channel nanowire structure 106. In an embodiment, a portion of the liner 122 that has been oxidized forms an oxide structure 131.

In an embodiment, the oxide/dielectric/converted structure 131 comprises an internal, self-aligned spacer structure 131, and is formed/located between adjacent channel nanowires 106. In an embodiment, the channel nanowires 106 may form a much thinner oxide/converted portion during the oxidation process 130. In an embodiment, the dielectric structure 131 may comprise silicon, carbon, oxides and/or nitrides of various stoichiometries, with oxygen, nitrogen and/or carbon in the range of 1-75 atomic percent of each element, as well as carbides formed from the liner material conversion 122, as a result of undergoing the conversion process 130.

An additional etch process (not shown), which may comprise a dry and/or wet etch in an embodiment, may be performed, wherein any converted portion of the channel nanowires that may have been formed (during the conversion process 130) may be removed. However, the internal spacer structure 131 may remain, i.e. the etch process may be highly selective, wherein substantially all of the converted portion of the channel nanowire structures 106 may be removed, but substantially all or in some cases mostly all of the portion of the internal spacer structure 131 may remain adjacent and between individual channel nanowire structures 106.

In an embodiment, the self-aligned internal spacer 131 may comprise a thickness/height of about 0.5 nm-10 nm. In other embodiments, the exact dimensions of the internal spacer 131 may vary, according to the particular application. In an embodiment, there may be a distance 105 between the nanowire channel structures, that may be between about 2 to about 50 nm, wherein the distance may be substantially equal to a height of the internal spacer 131. In an embodiment, the spacer structure 131 does not fully extend across the channel region.

In an embodiment, subsequent to the formation of the internal spacer 131 in an embodiment, a gate material 126 may be formed between the gate spacer(s) 120, wherein a portion of a non-planar device 132, such as a nanowire device, a nanoribbon device, a gate all round device, for example, may be formed (FIG. 10). In an embodiment, the gate material 126 may comprise a metal gate. In an embodiment, a high k gate oxide (not shown) may be formed adjacent the gate material 126. Source/drain contacts may also be formed to contact the source/drain structures in a source/drain contact region.

For example, FIG. 11 depicts a portion of a device 135 (shown as an approximation of a transmission electron microscope (TEM) or Scanning electron microscope (SEM) cross section (such as through B-B of FIG. 1), similar to the non-planar transistor device 132 from FIG. 10, for example. The device 135 may comprise a channel region 129, that may comprise a nanowire, nanoribbon or gate all around structure, for example, wherein an internal self-aligned spacers 131 may be adjacent and in between a first and second channel nanowire structure 106, 106'. The internal spacers 131 may be adjacent source/drain structures 124, wherein a liner 122 adjacent the source/drain structures 124 may be in direct contact with the internal spacer 131, in an embodiment. In an embodiment, the spacers 131 may comprise an oxide and/or carbide of the liner material 122. In an embodiment, the liner 122 may be at least partially located in a bottom portion and on a sidewall/outer region of the source/drain structures 124.

In an embodiment, the source/drain structures 124 may be electrically and mechanically coupled with source/drain contact structures 144, wherein the source/drain contact structures 144 may comprise a metal, such as tungsten, in an embodiment, and may further comprise a contact liner 146. The contact liner 146 may comprise a silicide material, such as titanium and/or tungsten silicide, for example, and may be disposed between the source/drain contact structure 144 and the source/drain structure 124. The device 135 further includes a gate structure 126, that may comprise multilayers, such as a work function layer and a fill metal layer, for example.

A gate dielectric layer 123, which may comprise a high k gate dielectric layer 123 in an embodiment, may be disposed/adjacent the gate structure 126. Gate spacers 120 may be adjacent the gate structure 126, and may comprise a pair of gate spacers 120 on opposite sides of the gate structure 126, in an embodiment. The source/drain structures 124 may be adjacent the gate spacers 120, and may be adjacent the gate structure 126. The gate spacers 120 may or may not be in direct contact with at least one of the channel nanowires 106, in an embodiment. The exact dimensions of the various features/structures of FIG. 11 may vary according to the particular design requirements. In addition the locations and adjacencies of the various features may vary, according to a particular embodiment.

The embodiments herein enable improved device performance by providing structures that serve to prevent gate to source/drain shorts. The embodiments provide smaller feature scaling ability for non-planar transistors, such as gate all around, nanowire and nanoribbon structures, and the like. Lower leakage, lower capacitance, higher gate control, and increased drive currents may be realized.

Figure 12:
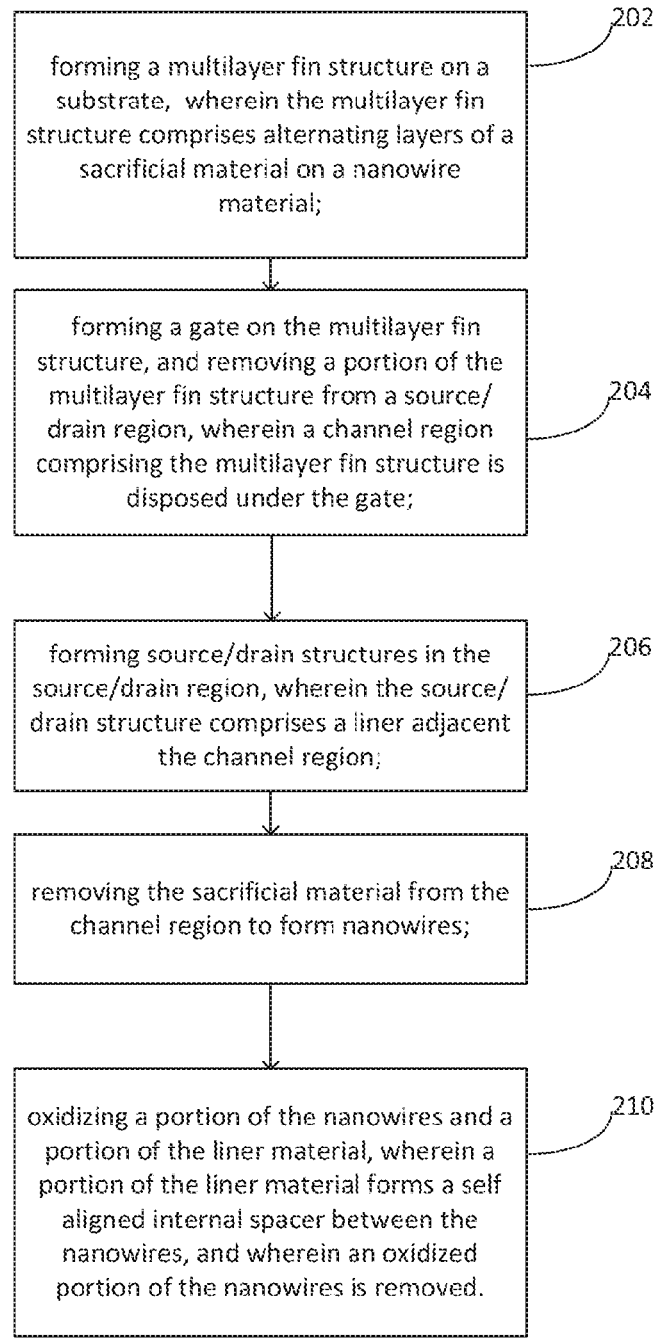
FIG. 12 represents a flow chart of a method according to embodiments.

FIG. 12 depicts a method according to embodiments herein. At step 202, a multilayer fin structure may be formed on a substrate, wherein the multilayer fin structure comprises alternating layers of a sacrificial material on a nanowire material. At step 204, a gate may be formed on the multilayer fin structure, and a portion of the multilayer fin structure may be removed from a source/drain region, wherein a channel region comprising the multilayer fin structure is disposed/remains under the gate. At step 206, source/drain structures may be formed in the source/drain region, wherein the source/drain structures comprises a liner adjacent the channel region. At step 208, the sacrificial material may be removed from the channel region to form nanowires. At step 210, a portion of the nanowires and a portion of the liner material may be oxidized, wherein a portion of the liner material forms a self-aligned internal spacer between the nanowires, and wherein an oxidized portion of the nanowires is removed.

The structures of the embodiments herein may be coupled with any suitable type of structures capable of providing electrical communications between a microelectronic device, such as a die, disposed in package structures, and a next-level component to which the package structures may be coupled (e.g., a circuit board).

The device structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. The structures/devices described in the various figures herein may comprise portions of a silicon logic die or a memory die, for example, or any type of suitable microelectronic device/die. In some embodiments the devices may further comprise a plurality of dies, which may be stacked upon one another, depending upon the particular embodiment. In an embodiment, the die(s) may be partially or fully embedded in a package structure.

The various embodiments of the device structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 13:
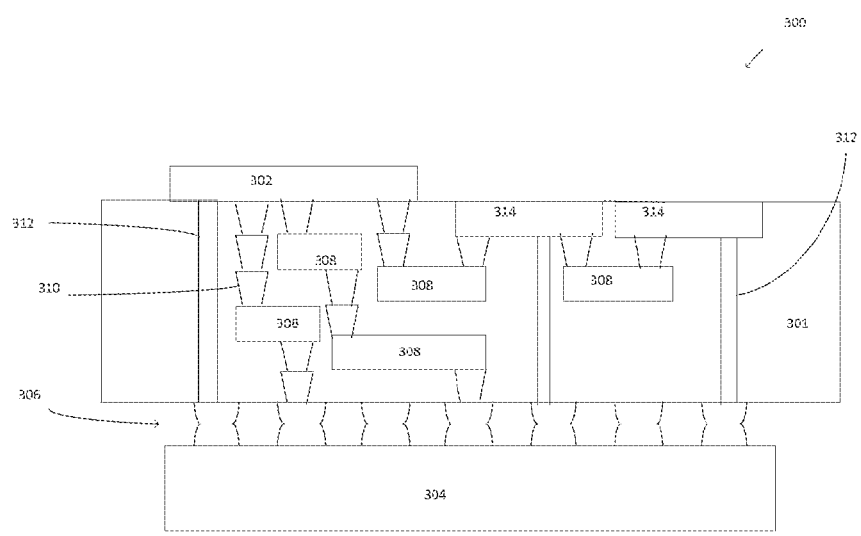
FIG. 13 represents an interposer implementing one or more embodiments.

FIG. 13 illustrates a device 300 that includes one or more embodiments included herein. The device 300 may include interposer 301, which may comprise an intervening substrate used to bridge a first substrate 302 to a second substrate 304. The first substrate 302 may be, for instance, any type of integrated circuit die, and may include embodiments of the nanowire spacer structures described herein, and may comprise a memory device, in an embodiment. The second substrate 304 may be, for instance, a memory module, a computer motherboard, a processor device, or any other integrated circuit die, and may include embodiments of the self-aligned spacer structures described herein. Generally, the purpose of an interposer 301 is to spread a connection to a wider pitch or to reroute a connection to a different connection.

For example, an interposer 301 may couple an integrated circuit die to a ball grid array (BGA) 306 that can subsequently be coupled to the second substrate 304. In some embodiments, the first and second substrates 302/304 are attached to opposing sides of the interposer 301. In other embodiments, the first and second substrates 302/304 are attached to the same side of the interposer 301. And in further embodiments, three or more substrates are interconnected by way of the interposer 301.

The interposer 301 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials. The interposer may include metal interconnects 308 and vias 310, and may also include through-silicon vias (TSVs) 312. The interposer 301 may further include embedded devices 314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 301. In accordance with embodiments, apparatuses or processes disclosed herein may be used in the fabrication of interposer 301.

Figure 14:
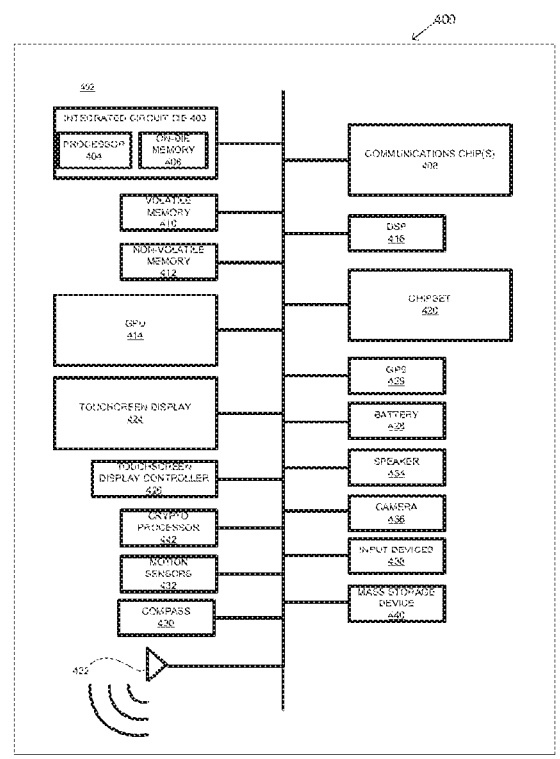
FIG. 14 represents a schematic of a system according to embodiments.

FIG. 14 is a schematic of a computing device 400 that may be implemented incorporating embodiments of the device structures described herein. In an embodiment, the computing device 400 houses a board 402, such as a motherboard 402 for example. The board 402 may include a number of components, including but not limited to a processor 404, and an on-die memory 406, that may be communicatively coupled with an integrated circuit die 403, and at least one communication chip 408. The processor 404 may be physically and electrically coupled to the board 402. In some implementations the at least one communication chip 408 may be physically and electrically coupled to the board 402. In further implementations, the communication chip 406 is part of the processor 404.

Depending on its applications, computing device 400 may include other components that may or may not be physically and electrically coupled to the board 402, and may or may not be communicatively coupled to each other. These other components include, but are not limited to, volatile memory (e.g., DRAM) 410, non-volatile memory (e.g., ROM) 412, flash memory (not shown), a graphics processor unit (GPU) 414, a digital signal processor (DSP) 416, a crypto processor 442, a chipset 420, an antenna 422, a display 424 such as a touchscreen display, a touchscreen controller 426, a battery 428, an audio codec (not shown), a video codec (not shown), a global positioning system (GPS) device 429, a compass 430, accelerometer, a gyroscope and other inertial sensors 432, a speaker 434, a camera 436, various input devices 438 and a mass storage device (such as hard disk drive, or solid state drive) 440, compact disk (CD) (not shown), digital versatile disk (DVD) (not shown), and so forth). These components may be connected to the system board 402, mounted to the system board, or combined with any of the other components.

The communication chip 408 enables wireless and/or wired communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 400 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Embodiments of the transistor devices described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a nanowire channel structure comprising a first nanowire and a second nanowire; a source/drain structure adjacent the nanowire channel structure, wherein the source/drain structure comprises a liner adjacent a sidewall region of the source/drain structure, and wherein the liner is also adjacent at least one of the first and second nanowires, a nanowire spacer structure in between the first nanowire and the second nanowire, wherein the nanowire spacer structure comprises a chemically converted portion of the liner material.

In Example 2, the structure of Example 1 including wherein the liner material comprises a material selected from the group consisting of silicon and carbon.

In Example 3, the structure of Example 1 including wherein the liner material comprises a silicon carbide material, wherein the carbon percentage is between about 1 percent to about 30 percent carbon.

In Example 4, the structure of Example 1 including wherein the liner comprises a thickness of between about 0.5 nm to about 5 nm.

In Example 5, the structure of Example 1 including wherein at least one of the first and second nanowires comprises silicon.

In Example 6, the structure of Example 1 including wherein the nanowire spacer comprises an oxide of silicon carbide.

In Example 7, the structure of Example 1 including wherein a portion of the liner is in direct contact with the nanowire spacer.

In Example 8, the structure of Example 1 including wherein the nanowire spacer structure does not fully extend across the channel region.

In Example 9 is a channel structure comprising a first nanowire and a second nanowire, wherein the first and second nanowires are separated by a distance, a source/drain structure adjacent the channel structure, wherein a liner material is disposed on at least a portion of a first side, a second side and a bottom portion of the source/drain material, and a nanowire spacer structure in contact with a portion of the liner and disposed between the first nanowire and the second nanowire.

In Example 10, the device of Example 9 including wherein the nanowire spacer structure comprises a dielectric material, and does not fully extend across a channel region.

In Example 11, the device of Example 9 further comprising a source/drain contact coupled to the source/drain structure.

In Example 12, the device of Example 9 including wherein the device comprises a portion of one of a NMOS or a PMOS transistor structure.

In Example 13, the device of Example 9 including wherein the device comprises one of a non-planar device, a gate all around device, or a nanowire device.

In Example 14, the device of Example 9 further comprising wherein the first and second nanowires comprise silicon.

In Example 15, the device of claim 9 including wherein the nanowire spacer comprises a converted portion of the liner.

In Example 16, the device of Example 9 wherein the device structure comprises a nanowire or a nanoribbon transistor structure.

Example 17 is a method of forming a multilayer fin structure on a substrate, wherein the multilayer fin structure comprises alternating layers of a sacrificial material and a nanowire material, forming a gate on the multilayer fin structure, wherein a portion of the multilayer fin structure comprises a channel region, forming source/drain structures adjacent the channel region, wherein a liner is formed on at least a sidewall portion of the source/drain structures, wherein the liner is adjacent the nanowire material, forming nanowires in the channel region, and oxidizing a portion of the liner material, wherein the oxidized portion of the liner material forms a nanowire spacer between the nanowires.

In Example 18 the method of Example 17 further comprising wherein the nanowires are formed by etching the sacrificial material from the channel region.

In Example 19, the method of Example 17 further comprising wherein the sacrificial material etches at a faster rate than the nanowire material.

In Example 20, the method of Example 17 further comprising wherein a portion of the nanowires are oxidized, and wherein the oxidized portion of the nanowires are removed.

In Example 21 the method of Example 17 further comprising wherein the liner material oxidizes at a faster rate than the nanowire material.

In Example 22 the method of Example 17, further comprising wherein the liner material comprises carbon and silicon.

In Example 23, the method of Example 17 further comprising wherein the liner material comprises a silicon carbide material, wherein the carbon percentage is between about 1 percent to about 30 percent carbon.

In Example 24 the method of Example 17 further comprising wherein the device comprises a portion of one of a FINFET, a tri-gate, a nanowire, or a nanoribbon transistor structure.

In Example 25, the method of Example 17 further comprising wherein the liner comprises a thickness of between about 0.5 nm to about 5 nm.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A transistor structure, comprising:
a channel structure comprising a first nanowire and a second nanowire;
source and drain structures adjacent to opposite ends of the channel structure, wherein the source and drain structures comprise a liner at least along a sidewall region of the source and drain structures, and wherein the liner is adjacent to at least one of the first and second nanowires; and
an internal spacer structure between the first nanowire and the second nanowire, wherein the internal spacer structure comprises one or more compositional constituents of the liner in addition to at least one of oxygen or nitrogen.

2. The transistor structure of claim 1, wherein the source and drain structures further comprise a source and drain material, and wherein the liner has a composition distinct from that of the source and drain material.

3. The transistor structure of claim 2, wherein the liner comprises silicon and carbon, and wherein a carbon percentage of the liner is between about 1 percent and about 30 percent.

4. The transistor structure of claim 2, wherein the liner has a thickness between about 0.5 nm to about 5 nm.

5. The transistor structure of claim 2, wherein the at least one of the first and second nanowires comprises silicon, and wherein the source and drain material is a semiconductor further comprising silicon or germanium.

6. The transistor structure of claim 5, wherein the internal spacer structure comprises silicon, carbon, and oxygen.

7. The transistor structure of claim 2, wherein a portion of the liner is between the nanowires and the source and drain material.

8. The transistor structure of claim 2, further comprising a gate material between the first and second nanowires, and wherein the internal spacer structure is between the gate material and the source and drain material.

9. A transistor structure, comprising:
a channel structure comprising a first nanowire and a second nanowire, wherein the first and second wires are separated by a distance;
source and drain structures adjacent to opposite ends of the channel structure, wherein a liner material is disposed on at least a portion of a first side, a second side, and a bottom portion of a source and drain semiconductor material, and wherein the liner material has a composition distinct from that of a source and drain semiconductor material;

a spacer structure in contact with a portion of the liner material, and disposed between the first nanowire and the second nanowire; and a gate material within at least a portion of the distance between the first and second nanowires, wherein the spacer structure is between the gate material and the source and drain semiconductor material.

10. The transistor structure of claim 9, wherein the spacer structure comprises one or more compositional constituents of the liner material in addition to at least one of oxygen or nitrogen.

11. The transistor structure of claim 9, further comprising a contact coupled to each of the source and drain semiconductor material.

12. The transistor structure of claim 9, wherein the transistor structure is an NMOS or a PMOS transistor structure.

13. The transistor structure of claim 9, wherein the transistor structure is at least one of a non-planar device, a gate all around device, or a nanowire device.

14. The transistor structure of claim 9, wherein the first and second nanowires comprise silicon and the source and drain material is a semiconductor comprising silicon or germanium.

15. A method of forming a transistor structure, the method comprising:

forming a multilayer fin structure on a substrate, wherein the multilayer fin structure comprises alternating layers of a sacrificial material and a nanowire material;

forming source and drain structures adjacent to opposite ends of the fin structure, wherein forming the source and drain structures comprises forming a liner on at least a sidewall portion of the fin structure, adjacent the nanowire material;

forming nanowires from the fin structure by etching the sacrificial material away from the nanowire material, the etching selective to the sacrificial material relative to liner material;

forming an internal spacer structure between the nanowires by oxidizing a portion of the liner material exposed by the etching of the sacrificial material; and forming a gate between the source and drain structures by backfilling at least a portion of a space between the nanowire material and adjacent to the internal spacer structure.

16. The method of claim 15, wherein forming the source and drain structures further comprises depositing a source and drain semiconductor material over the liner.

17. The method of claim 16, wherein the etching of sacrificial material is selective to the sacrificial material relative to the nanowire material.

18. The method of claim 15, wherein the forming of the internal spacer structure further comprises oxidizing a portion of the nanowire material.

19. The method of claim 18, wherein the oxidizing of the liner material occurs at a faster rate than the oxidizing of the nanowire material.

20. The method of claim 15, wherein the liner material comprises carbon and silicon.

21. The method of claim 20 wherein the liner material comprises a carbon percentage between about 1 percent and about 30 percent.

* * * * *